United States Patent
Kim et al.

(10) Patent No.: US 12,183,654 B2
(45) Date of Patent: Dec. 31, 2024

(54) INSULATING SUBSTRATE AND POWER MODULE USING THE SAME

(71) Applicants: Hyundai Motor Company, Seoul (KR); Kia Corporation, Seoul (KR)

(72) Inventors: Hyeon Uk Kim, Gyeonggi-do (KR); Jun Hee Park, Gyeonggi-Do (KR); Sung Won Park, Incheon (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 0 days.

(21) Appl. No.: 18/348,049

(22) Filed: Jul. 6, 2023

(65) Prior Publication Data

US 2023/0352364 A1 Nov. 2, 2023

Related U.S. Application Data (63) Continuation of application No. 17/409,348, filed on Aug. 23, 2021, now Pat. No. 11,728,239.

(30) Foreign Application Priority Data

Oct. 13, 2020 (KR) .................. 10-2020-0132097

(51) Int. Cl.
*H01L 23/373* (2006.01)
*H01L 23/367* (2006.01)
*H01L 23/051* (2006.01)
*H01L 23/31* (2006.01)
(Continued)

(52) U.S. Cl.
CPC ...... *H01L 23/3735* (2013.01); *H01L 23/3675* (2013.01); *H01L 23/051* (2013.01); *H01L 23/3121* (2013.01); *H01L 23/36* (2013.01); *H01L 23/49575* (2013.01)

(58) Field of Classification Search
CPC ............ H01L 23/3735; H01L 23/3675; H01L 23/3121; H01L 23/49575; H01L 24/32; H01L 24/33; H01L 24/48; H01L 23/373; H01L 23/645; H01L 23/473; H01L 24/73; H01L 2224/32225; H01L 2224/32245; H01L 2224/33181; H01L 2224/48247; H01L 2224/73215; H01L 2224/73265; H01L 2924/19042; H01L 23/4334; H01L 23/367; H01L 23/3731; H01L 23/3736; H01L 23/485; H01L 23/36; H01L 23/051
See application file for complete search history.

(56) References Cited

U.S. PATENT DOCUMENTS 11,728,239 B2* 8/2023 Kim .................. H01L 23/3735
257/706
2005/0139954 A1 6/2005 Pyo
(Continued)

FOREIGN PATENT DOCUMENTS

KR 10-2020-0038615 A 4/2020

*Primary Examiner* — Patricia D Valenzuela
(74) *Attorney, Agent, or Firm* — Fox Rothschild LLP (57) ABSTRACT

An insulating substrate provided between the semiconductor chip and a cooler in the dual-side cooled power module includes: an inner metal layer configured to face the semiconductor chip; an outer metal layer configured to face the cooler; and an insulating layer interposed between the inner metal layer and the outer metal layer, wherein at least one inner thermal spreader of a plurality of inner thermal spreader is inserted into the inner metal layer.

14 Claims, 8 Drawing Sheets

100(110,120,130)
200(210,220,230)

(51) Int. Cl.
*H01L 23/36* (2006.01)
*H01L 23/495* (2006.01)

(56) References Cited

U.S. PATENT DOCUMENTS

2019/0103340 A1  4/2019  Tsuchimochi
2021/0007393 A1  1/2021  Jung et al.

* cited by examiner

INSULATING SUBSTRATE AND POWER MODULE USING THE SAME

CROSS REFERENCE TO RELATED APPLICATION

The present application is a continuation of U.S. patent application Ser. No. 17/409,348, filed Aug. 23, 2021, which claims priority to and the benefit of Korean Patent Application No. 10-2020-0132097, filed Oct. 13, 2020, the entire contents of which is incorporated herein for all purposes by this reference.

TECHNICAL FIELD

The present disclosure relates to an insulating substrate and a power module using the same.

BACKGROUND

In order to drive a hybrid vehicle or an electric vehicle, it is essential to apply an electrically powered motor. Such a motor is controlled by a power module to regulate an operating time point and an output.

Since high-power electricity is continuously applied to the power module, a lot of heat is generated. In order to cool the power module, many methods have been considered. Among them, a power module has a structure in which substrates are provided on both sides of a semiconductor chip, which is a core component, and coolers are provided on the respective substrates to cool the semiconductor chip from both sides of the semiconductor chip.

Meanwhile, the semiconductor chip is generally bonded to a signal lead by a wire to transmit an operation signal to the semiconductor chip.

Due to the nature of the wire bonding, a surface of the wire is inevitably curved. Thus, a spacer is installed between the substrate and the semiconductor chip to prevent a contact between the wire and the substrate.

Then, in order to effectively dissipate heat generated from the semiconductor chip, substrates are disposed and mounted on both sides of the semiconductor chip. In this case, the substrate needs to not only secure a heat diffusion path for dissipating heat but also secure a path through which an electrical signal is transmitted. For this reason, an insulating substrate in which an insulating material is interposed between conductive materials has been applied.

The contents described as the related art have been provided only to assist in understanding the background of the present disclosure and should not be considered as corresponding to the related art known to those having ordinary skill in the art.

SUMMARY

The present disclosure provides an insulating substrate capable of securing a path for diffusing heat generated from a semiconductor chip to improve heat dissipation efficiency, and a power module using the same.

According to an embodiment of the present disclosure, an insulating substrate provided between a semiconductor chip and a cooler in a power module includes: an inner metal layer disposed to face the semiconductor chip; an outer metal layer disposed to face the cooler; and an insulating layer interposed between the inner metal layer and the outer metal layer, wherein at least one inner thermal spreader is inserted into the inner metal layer.

The inner metal layer may be formed as an inner metal plate that is formed of a copper (Cu) material in a plate shape, and the inner thermal spreader may be formed of a material including at least graphite, and formed in a graphene to be disposed parallel to a surface facing the semiconductor chip among surfaces of the inner metal plate.

The inner thermal spreader may be disposed on a virtual surface where the inner thermal spreader is disposed inside the inner metal plate, excluding at least a virtual area transferred vertically from an area in which the semiconductor chip is disposed, along a periphery of the virtual area.

The inner thermal spreader may be disposed on a virtual surface where the inner thermal spreader is disposed inside the inner metal plate, including at least an edge of a virtual area transferred vertically from an area in which the semiconductor chip is disposed, along a periphery of the virtual area.

The inner thermal spreader may be disposed parallel to a center point of the inner metal plate based on a thickness direction.

At least one outer thermal spreader may be inserted into the outer metal layer.

The outer metal layer may be formed as an outer metal plate that is formed of a copper (Cu) material in a plate shape, and the outer thermal spreader may be formed of a material including at least graphite, and formed in a graphene to be disposed parallel to a surface facing the semiconductor chip among surfaces of the outer metal plate.

According to another embodiment of the present disclosure, a power module in which a semiconductor chip is provided between a pair of coolers includes: a pair of insulating substrates provided between the semiconductor chip and the pair of coolers, respectively, each of the insulating substrates including: an inner metal layer disposed to face the semiconductor chip and having at least one inner thermal spreader inserted therein; an outer metal layer disposed to face a corresponding one of the coolers; and an insulating layer interposed between the inner metal layer and the outer metal layer.

The power module may further include: a signal lead transmitting and receiving a signal to and from the semiconductor chip; a wire connecting the semiconductor chip and the signal lead to each other; and a spacer disposed between the semiconductor chip and any one of the pair of insulating substrates.

The inner metal layer may be formed as an inner metal plate that is formed of a copper (Cu) material in a plate shape, and the inner thermal spreader may be formed of a material including at least graphite, and formed in a graphene to be disposed parallel to a surface facing the semiconductor chip among surfaces of the inner metal plate.

At least one outer thermal spreader may be inserted into the outer metal layer.

The outer metal layer may be formed as an outer metal plate that is formed of a copper (Cu) material in a plate shape, and the outer thermal spreader may be formed of a material including at least graphite, and formed in a graphene to be disposed parallel to a surface facing the semiconductor chip among surfaces of the outer metal plate.

DETAILED DESCRIPTION

Hereinafter, embodiments of the present disclosure will be described in more detail with reference to the accompanying drawings. However, the present disclosure is not limited to the embodiments to be disclosed below, and may be in implemented in various different forms. The embodiments are provided so that the present disclosure will be thorough and complete and will fully convey the scope of the disclosure to those skilled in the art. Like reference numerals in the drawings refer to like elements.

Figure 1:
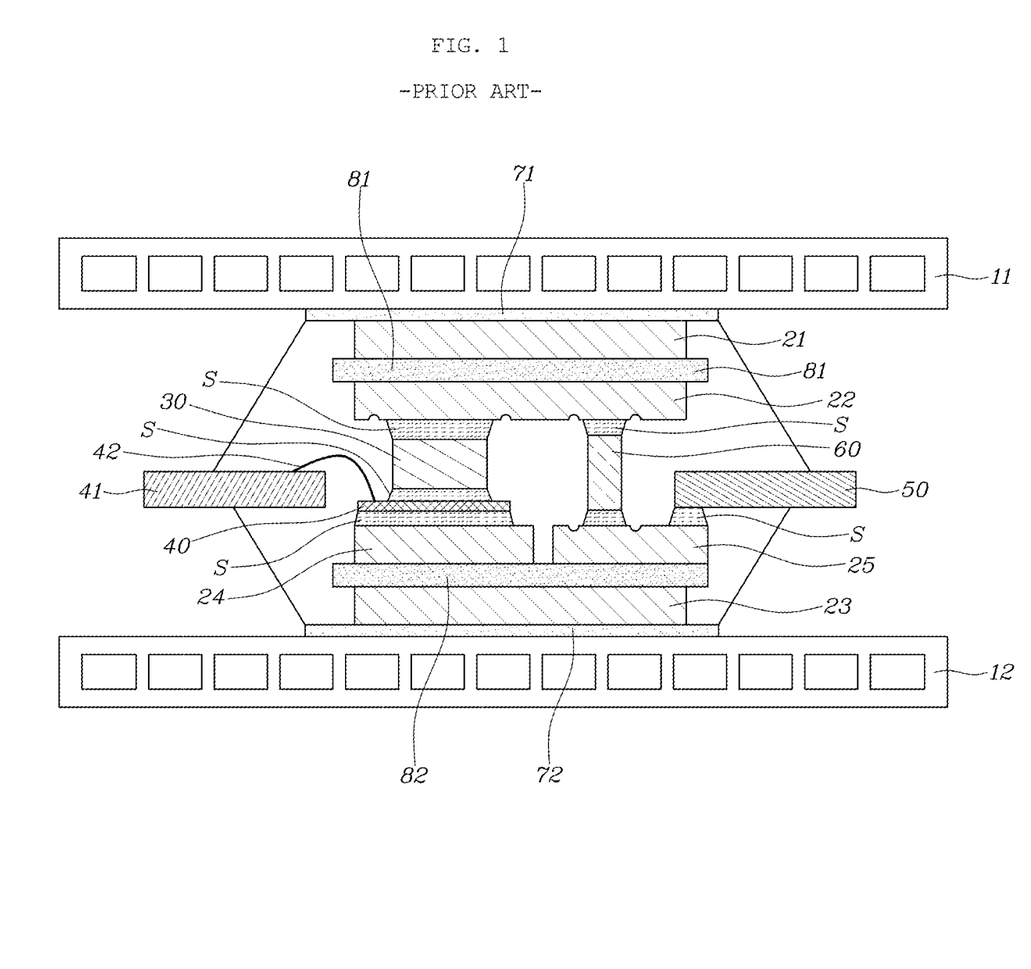
FIG. 1 is a cross-sectional view illustrating a general power module.

FIG. 1 is a cross-sectional view illustrating a general power module.

As illustrated in FIG. 1, the general power module includes an upper cooler 11 and a lower cooler 12, with a semiconductor chip 40 disposed between the upper cooler 11 and the lower cooler 12. In this case, insulating substrates are disposed on both sides of the semiconductor chip 40, respectively, between the upper cooler 11 and the lower cooler 12, the insulating substrates including metal layers 21 to 25 formed of a metal material and insulating layers 81 and 82 formed of an insulating material, and the metal layers 21 and 23 are bonded to the upper cooler 11 and the lower cooler 12 by thermal interface materials (TIMs) 71 and 72, respectively.

In addition, the semiconductor chip 40 is connected to a signal lead 41 via a wire 42. Further, a power lead 50 connected to the semiconductor chip 40 via the metal layer 22 or 25 may be provided, a spacer 30 may be provided to maintain a distance between the metal layer 22 and the semiconductor chip 40, and a via spacer 60 may be provided to maintain a distance between the metal layer 22 and the metal layer 25.

In addition, by soldering S, the metal layer 22 is bonded to the spacer 30 and the spacer 30 is bonded to the semiconductor chip 40.

Meanwhile, in order to increase the heat dissipation effect of the insulating substrates, copper (Cu) having good thermal conductivity has been used for the metal layers 22 to 25, and a ceramic material has been used for the insulating layers 81 and 82. However, such a general structure has a problem in that the ceramic material may be damaged during operation due to a difference in thermal expansion coefficient between the copper (Cu) forming the metal layers 22 to 25 and the ceramic material forming the insulating layers 81 and 82. Thus, the thickness of the insulating layers 81 and 82 needs to be secured to some extent. For this reason, there has been a limit in increasing the thickness of the metal layers 22 to 25.

Recently, an insulating substrate implemented with the insulating layers 81 and 82 formed of an organic-inorganic composite material instead of the ceramic material has been used. However, although the insulating substrate to which the organic-inorganic composite material is applied has slightly thicker metal layers 22 to 25 than the insulating substrate to which the ceramic material is applied, the thickness of the metal layers 22 to 25 cannot be increased indefinitely. Thus, there has been a limit in improving the heat dissipation effect.

Meanwhile, attempts have recently been made to improve diffusion of heat emitted from the semiconductor chip 40 through the insulating substrates by placing graphite sheets between the insulating substrates and the coolers 11 and 12, respectively. However, the graphite sheet has low thermal conductivity in a vertical direction, while having good thermal conductivity in a horizontal direction. Thus, it has not been helpful in the dissipation of the heat generated from the semiconductor chip 40 to place the graphite sheets between the insulating substrates and the coolers 11 and 12, respectively.

Figure 2:
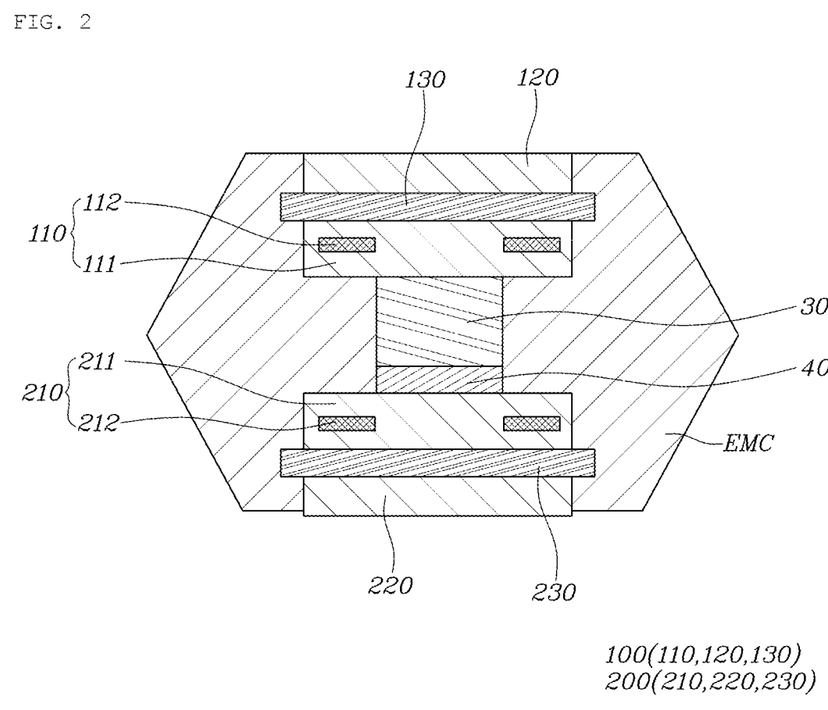
FIG. 2 is a cross-sectional view illustrating an insulating substrate according to an embodiment of the present disclosure.
Figure 3:
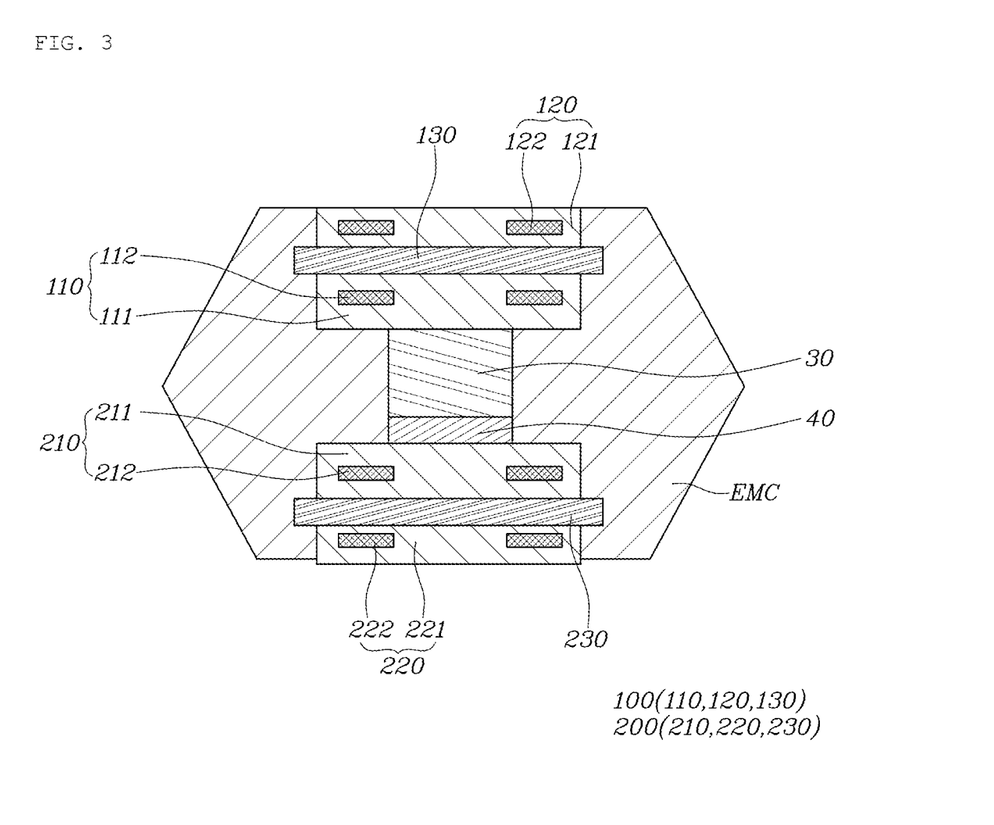
FIG. 3 is a cross-sectional view illustrating an insulating substrate according to another embodiment of the present disclosure.

FIG. 2 is a cross-sectional view illustrating an insulating substrate in some forms of the present disclosure, and FIG. 3 is a cross-sectional view illustrating an insulating substrate in some forms of the present disclosure.

Like the insulating substrates illustrated in FIG. 1, a pair of insulating substrates 100 and 200 are provided between an upper cooler 11 and a semiconductor chip 40 and between the semiconductor chip 40 and a lower cooler 12, respectively, according to an embodiment of the present disclosure.

In this case, a power module including the insulating substrates 100 and 200 includes: a signal lead 41 transmitting and receiving a signal to and from the semiconductor chip 40; a wire 42 connecting the semiconductor chip 40 and the signal lead 41 to each other; and a spacer 30 disposed between the semiconductor chip 40 and any one of the pair of insulating substrates 100 and 200.

The components constituting the power module other than the insulating substrates 100 and 200, and the positions and the bonding method of the insulating substrates 100 and 200 are the same as those in the general power module illustrated in FIG. 1. Thus, overlapping descriptions will be omitted.

Meanwhile, in the present embodiment, the insulating substrates 100 and 200 each have at least one thermal spreader 112, 122, 212, or 222 inserted thereinto to additionally secure a thermal diffusion path therein.

More specifically, as illustrated in FIG. 2, the insulating substrates 100 and 200 are divided into a first insulating substrate 100 disposed between the upper cooler 11 and the semiconductor chip 40 and a second insulating substrate 200 disposed between the semiconductor chip 40 and the lower cooler 12. In this case, the first insulating substrate 100 and the second insulating substrate 200 are preferably symmetric to each other with respect to the semiconductor chip 40. Therefore, overlapping descriptions will be described based on the second insulating substrate 200 below.

Each of the first insulating substrate 100 and the second insulating substrate 200 includes an inner metal layer 110 or 210 disposed to face the semiconductor chip 40; an outer metal layer 120 or 220 disposed to face the cooler 11 or 12; and an insulating layer 130 or 230 interposed between the inner metal layer 110 or 210 and the outer metal layer 120 or 220.

In this case, the inner metal layer 110 of the first insulating substrate 100 is in indirect contact with the semiconductor chip 40 via the spacer 30. In addition, the inner metal layer 210 of the second insulating substrate 200 is in direct contact with the semiconductor chip 40.

Each of the inner metal layers 110 and 210 of the first insulating substrate 100 and the second insulating substrate 200 is formed as an inner metal plate 111 or 211 that is formed of a metal material, and at least one inner thermal spreader 112 or 212 is inserted into the inner metal plate 111 or 211.

The inner metal plates 111 and 211, which serve to not only dissipate heat generated from the semiconductor chip 40 but also transmit an operation signal or power to the semiconductor chip 40, are formed of a material that is excellent is thermal conductivity and electrical conductivity. For example, the inner metal plates 111 and 211 are formed of a copper (Cu) material in a plate shape.

In addition, the outer metal layers 120 and 220, which serve to dissipate heat generated from the semiconductor chip 40, are formed of a material that is excellent in thermal conductivity. For example, like the inner metal plates 111 and 211, the outer metal layers 120 and 220 are also formed of a copper (Cu) material in a plate shape.

On the other hand, the insulating layers 130 and 230 interposed between the inner metal plates 111 and 211 and the outer metal layers 120 and 220, which need to electrically insulate the inner metal plates 111 and 211 and the outer metal layers 120 and 220, respectively, are formed of an insulating material. For example, the insulating layers 130 and 230 are formed of an organic-inorganic composite material in a sheet shape. Of course, the material of the insulating layers 130 and 230 is not limited to the organic-inorganic composite material, and a ceramic material may be applied thereto.

In addition, the inner thermal spreaders 112 and 212 are formed of a material including at least graphite, preferably a graphite material, each being preferably formed in a graphene to be disposed parallel to a surface facing the semiconductor chip 40 among surfaces of the inner metal plate 111 or 211. In particular, each of the inner thermal spreaders 112 and 212 is preferably disposed parallel to a center point of the inner metal plate 111 or 211 based on a thickness direction. In this case, the center point based on the thickness direction refers to a place around the ½ point rather than the exact ½ point based on the thickness direction.

The reason for forming the inner thermal spreaders 112 and 212 in the graphene and disposing the inner thermal spreaders 112 and 212 parallel to the respective surfaces of the inner metal plates 111 and 211, is that the graphene forming the inner thermal spreaders 112 and 212 has better thermal conductivity in a horizontal direction than in a vertical direction.

Meanwhile, each of the inner thermal spreaders 112 and 212 is preferably disposed on a virtual surface where the inner thermal spreader 112 or 212 is disposed inside the inner metal plate 111 or 211, excluding at least a virtual area transferred vertically from an area in which the semiconductor chip 40 is disposed, along a periphery of the virtual area. For example, as can be seen from FIG. 2, each of the inner thermal spreaders 112 and 212 is inserted into the inner metal plate 111 or 211 at a position slightly out of the virtual area transferred vertically from the area where the semiconductor chip 40 is disposed. In this case, one inner thermal spreader 112 and one inner thermal spreader 212 may be inserted into the inner metal plates 111 and 211, respectively, along a periphery of the semiconductor chip 40 in a form of a closed curve, or multiple inner thermal spreaders 112 and multiple inner thermal spreaders 212 may be inserted into the inner metal plates 111 and 211, respectively, along the periphery of the semiconductor chip 40, while being spaced apart from each other at a predetermined distance.

This is because, if each of the inner thermal spreaders 112 and 212 is inserted into the virtual area transferred vertically from the area where the semiconductor chip 40 is disposed, the inner thermal spreaders 112 and 212 may rather block heat diffusion paths through which heat generated from the semiconductor chip 40 is transmitted in the vertical direction, thereby reducing heat dissipation efficiency.

In addition, each of the inner thermal spreaders 112 and 212 may be disposed on the virtual surface where the inner thermal spreader 112 or 212 is disposed inside the inner metal plate 111 or 211, including an edge of the virtual area transferred vertically from the area in which the semiconductor chip 40 is disposed, along the periphery of the virtual area. For example, as can be seen from FIG. 3, each of the inner thermal spreaders 112 and 212 is inserted into the inner metal plate 111 or 211 at a position slightly including the edge of the virtual area transferred vertically from the area where the semiconductor chip 40 is disposed. In this case as well, one inner thermal spreader 112 and one inner thermal spreader 212 may be inserted into the inner metal plates 111 and 211, respectively, along a periphery of the semiconductor chip 40 in a form of a closed curve, or multiple inner thermal spreaders 112 and multiple inner thermal spreaders 212 may be inserted into the inner metal plates 111 and 211, respectively, along the periphery of the semiconductor chip 40, while being spaced apart from each other at a predetermined distance.

In addition, in the present disclosure, in order to further improve the heat dissipation efficiency of the insulating substrates 100 and 200, thermal spreaders 122 and 222 may also be inserted into the outer metal layers 120 and 220 constituting the insulating substrates 100 and 200, respectively.

As illustrated in FIG. 3, the insulating substrates 100 and 200 according to another embodiment of the present disclosure include inner metal layers 110 and 210 formed of inner metal plates 111 and 211 and inner thermal spreaders 112 and 212, insulating layers 130 and 230, and outer metal layers 120 and 220, respectively.

In this case, like the inner metal layers 110 and 210, each of the outer metal layers 120 and 220 is formed as an outer metal plate 121 or 221 that is formed of a metal material, and at least one outer thermal spreader 122 or 222 is inserted into the outer metal plate 121 or 221.

In addition, the outer metal plates 121 and 221 are formed of a material that is excellent in thermal conductivity to dissipate heat generated from the semiconductor chip 40. For example, the outer metal plates 121 and 221 are formed of a copper (Cu) material in a plate shape.

In addition, the outer thermal spreaders 122 and 222 are formed of a material including at least graphite, preferably a graphite material, each being preferably formed in a graphene to be disposed parallel to a surface facing the semiconductor chip 40 among surfaces of the outer metal plate 121 or 221.

In this case, the outer thermal spreaders 122 and 222 are preferably inserted to be symmetric to the inner thermal spreaders 112 and 212 with respect to the insulating layers 130 and 230, respectively.

Next, heat diffusion characteristics of the insulating substrate according to the present disclosure will be described through an example and comparative examples.

Figure 4A:
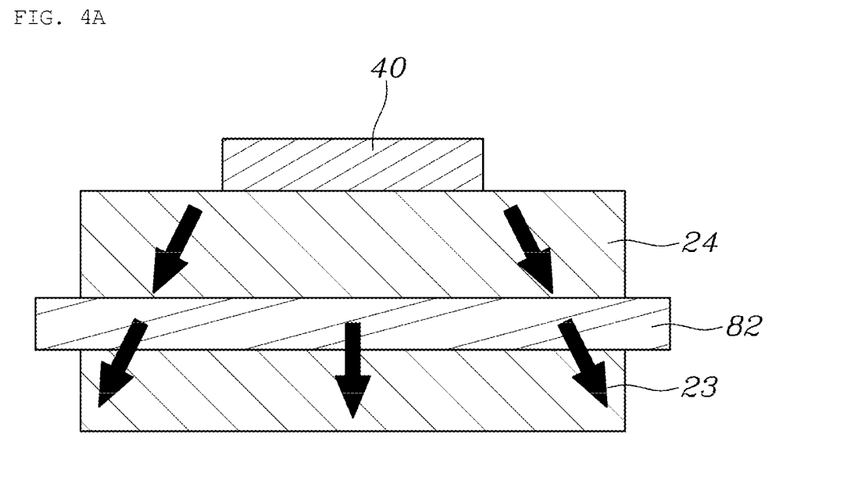
FIGS. 4A to 4C are views illustrating heat conduction paths of insulating substrates in an example and comparative examples.
Figure 4B:
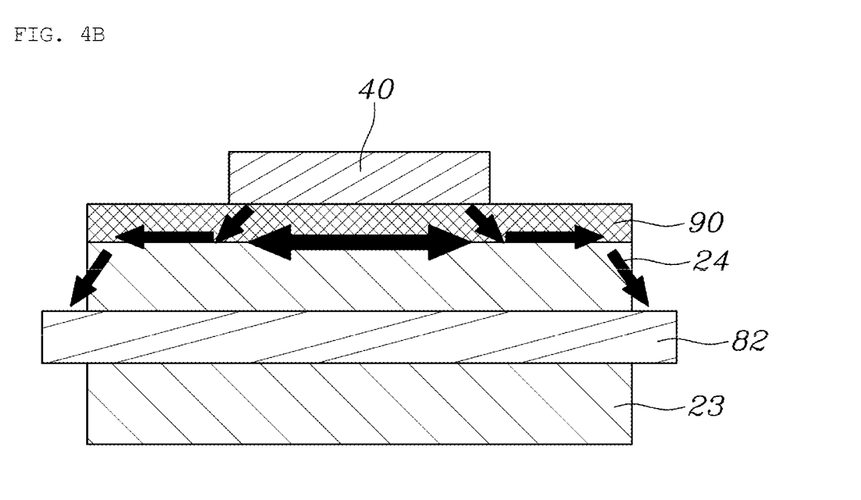
Figure 4C:
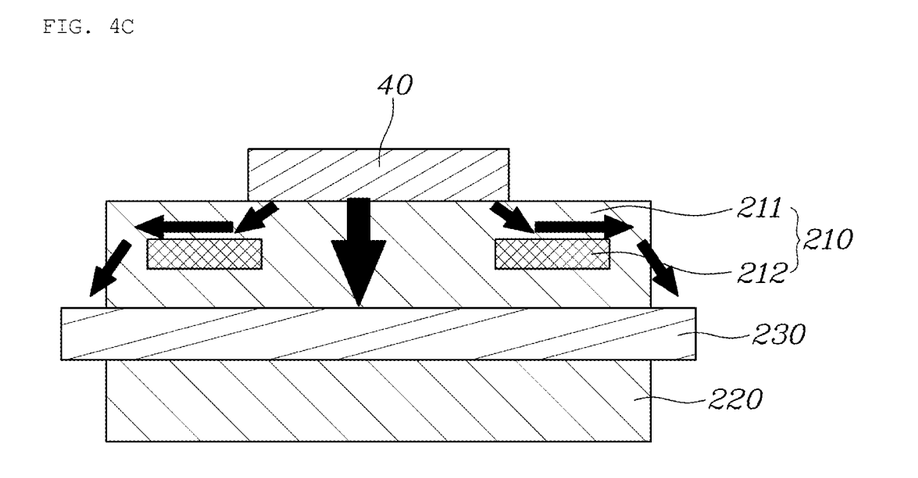
Figure 5A:
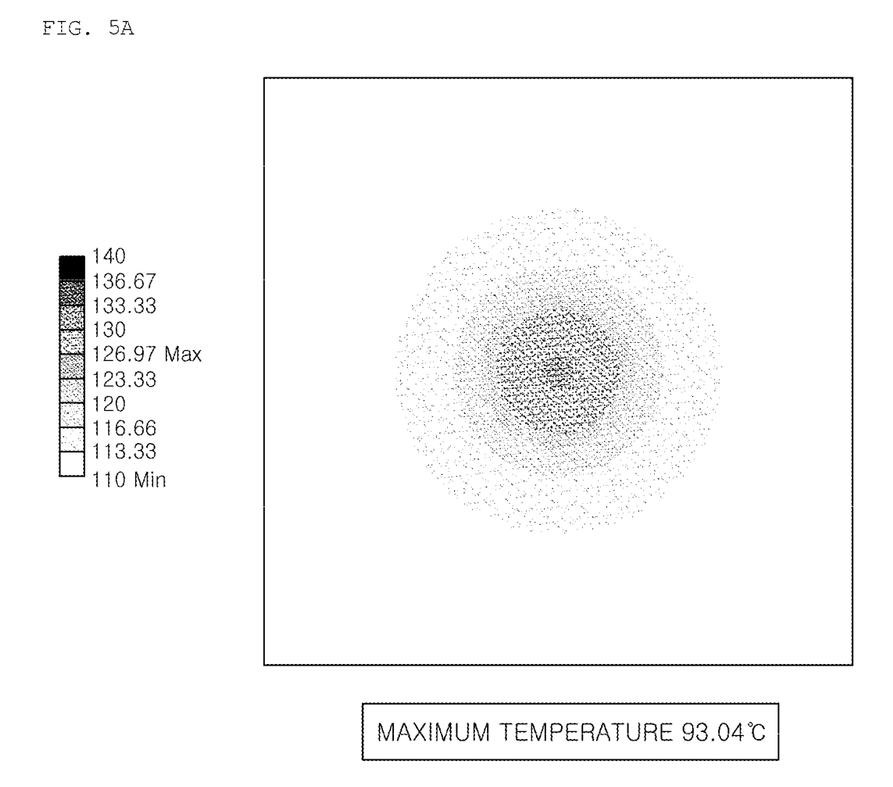
FIGS. 5A to 5C are views illustrating degrees of heat diffusion of the insulating substrates in the example and the comparative examples.
Figure 5B:
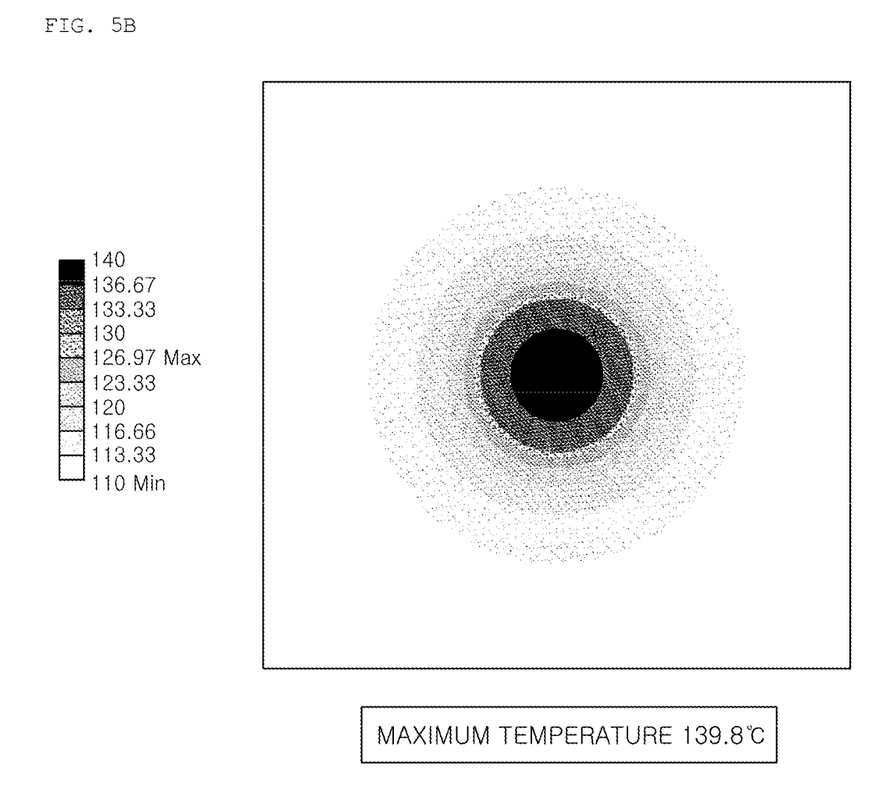
Figure 5C:
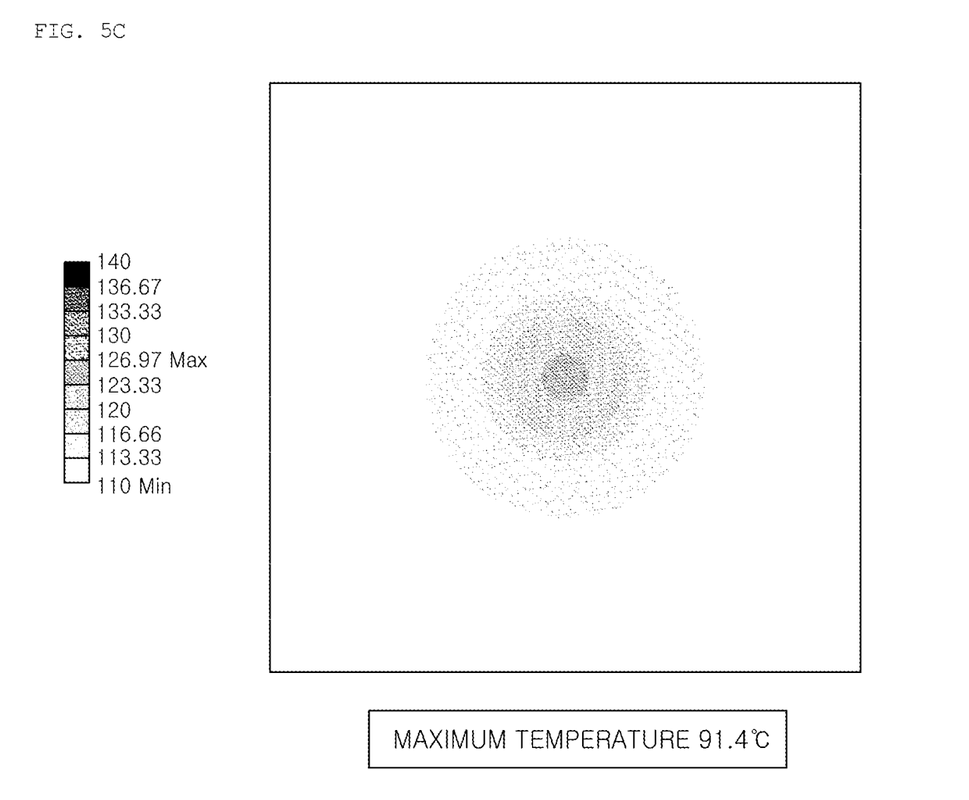

FIGS. 4A to 4C are views illustrating heat conduction paths of insulating substrates in an example and comparative examples, and FIGS. 5A to 5C are views illustrating degrees of heat diffusion of the insulating substrates in the example and the comparative examples.

FIG. 4A illustrates a conventional general insulating substrate as Comparative Example 1. In this insulating substrate, an insulating layer 82 formed of an organic-inorganic composite material is interposed between a pair of metal layers 23 and 24 formed of copper (Cu). A semiconductor chip 40 is mounted on the metal layer 24 for operation.

FIG. 4B illustrates an insulating substrate to which a graphite sheet is applied as Comparative Example 2. In this insulating substrate, an insulating layer 82 formed of an organic-inorganic composite material is interposed between a pair of metal layers 23 and 24 formed of copper (Cu) as in Comparative Example 1. A graphite sheet 90 is interposed between the metal layer 24 and a semiconductor chip 40.

FIG. 4C illustrates an insulating substrate according to an embodiment of the present disclosure as Example. In this insulating substrate, the insulating layer 230 formed of an organic-inorganic composite material is interposed between the inner metal layer 210 and the outer metal layer 220. The semiconductor chip 40 is mounted on the inner metal layer 210 for operation. In this case, the inner metal layer 210 is formed of the inner metal plate 211 that is formed of copper (Cu), and the inner thermal spreader 212 formed of a graphite material is inserted into the inner metal plate 211. In addition, the outer metal layer 220 is formed of copper (Cu).

In each of Comparative Examples 1 and 2 and Example as illustrated in FIGS. 4A to 4C, in order to check a maximum temperature and a heat distribution state, the semiconductor chip mounted on the insulating substrate was activated until the insulating substrate reached the maximum temperature. The results are as shown in FIGS. 5A to 5C.

FIG. 5A shows a result of Comparative Example 1, FIG. 5B shows a result of Comparative Example 2, and FIG. 5C is a result of Example. Arrows in FIGS. 5A to 5C indicate heat diffusion paths.

As can be seen from FIGS. 5A to 5C, it was confirmed that the maximum temperature was lowest in Example according to the present disclosure, as compared with those in Comparative Examples 1 and 2.

Particularly, when Example was compared with Comparative Example 2 in which the graphite sheet was used, it was confirmed that, although both used a thermal diffusion means formed of graphite for thermal diffusion, the results were significantly different in terms of the maximum temperature depending on the position of the thermal diffusion means. In addition, in terms of heat distribution, it was also confirmed that heat dissipation was better in Example than in Comparative Example 2.

Therefore, it was confirmed that the heat generated from the semiconductor chip could be effectively dissipated by inserting the thermal spreader formed of a graphite material in a graphene into the metal plate and disposing the thermal spreader parallel to the surface of the metal plate as suggested by the present disclosure.

In some forms of the present disclosure, the heat dissipation efficiency of the power module can be improved by inserting the thermal spreader, which is capable of additionally securing a heat diffusion path, into the metal layer constituting the insulating substrate.

In particular, the heat diffusion path can be expanded by forming the thermal spreader with a graphene, which has better thermal conductivity in the horizontal direction than in the vertical direction, and inserting the thermal spreader into the metal layer to be parallel to the surface of the metal layer. Accordingly, an improvement in the heat dissipation efficiency of the power module can be expected.

Although the present disclosure has been shown and described with respect to specific embodiments, it will be apparent to those having ordinary skill in the art that the present disclosure may be variously modified and altered without departing from the spirit and scope of the present disclosure as defined by the following claims.

What is claimed is:

1. An insulating substrate provided between a semiconductor chip and a cooler in a power module, the insulating substrate comprising:
   an inner metal layer configured to face the semiconductor chip;
   an outer metal layer configured to face the cooler; and
   an insulating layer interposed between the inner metal layer and the outer metal layer,
   wherein at least one inner thermal spreader of a plurality of inner thermal spreader is inserted into the inner metal layer,
   wherein the inner thermal spreader is disposed on a virtual surface where the inner thermal spreader is disposed inside the inner metal layer, including at least an edge of a virtual area transferred vertically from an area in which the semiconductor chip is disposed, along a periphery of the virtual area.

2. The insulating substrate of claim 1, wherein the inner metal layer is formed as an inner metal plate that is formed of a copper (Cu) material in a plate shape, and
   the inner thermal spreader is formed of a material including at least graphite, and disposed parallel to a surface facing the semiconductor chip among surfaces of the inner metal plate.

3. The insulating substrate of claim 2, wherein the inner thermal spreader is formed of a graphene.

4. The insulating substrate of claim 2, wherein the inner thermal spreader is disposed parallel to a center point of the inner metal plate corresponding to a thickness direction.

5. The insulating substrate of claim 1, wherein at least one outer thermal spreader of a plurality of outer thermal spreader is inserted into the outer metal layer.

6. The insulating substrate of claim 5, wherein the outer metal layer is formed as an outer metal plate that is formed of a copper (Cu) material in a plate shape, and the outer thermal spreader is formed of a material including at least graphite, and disposed parallel to a surface facing the semiconductor chip among surfaces of the outer metal plate.

7. The insulating substrate of claim 6, wherein the outer thermal spreader is formed of a graphene.

8. A power module in which a semiconductor chip is provided between a pair of coolers, the power module comprising:
   a pair of insulating substrates provided between the semiconductor chip and the pair of coolers, respectively,
   each of the insulating substrates including:
      an inner metal layer configured to face the semiconductor chip and having at least one inner thermal spreader inserted into the inner metal layer;
      an outer metal layer configured to face a corresponding cooler; and
      an insulating layer interposed between the inner metal layer and the outer metal layer,
   wherein the inner thermal spreader is disposed on a virtual surface where the inner thermal spreader is disposed inside the inner metal layer, including at least an edge of a virtual area transferred vertically from an area in which the semiconductor chip is disposed, along a periphery of the virtual area.

9. The power module of claim 8, further comprising:
   a signal lead configured to transmit and receive a signal to and from the semiconductor chip;

a wire connecting the semiconductor chip and the signal lead; and a spacer disposed between the semiconductor chip and the pair of insulating substrates.

10. The power module of claim 8, wherein the inner metal layer is formed as an inner metal plate that is formed of a copper (Cu) material in a plate shape, and the inner thermal spreader is formed of a material including at least graphite, and disposed parallel to a surface facing the semiconductor chip among surfaces of the inner metal plate.

11. The power module of claim 10, wherein the inner thermal spreader is formed of a graphene.

12. The power module of claim 8, wherein at least one outer thermal spreader of a plurality of outer thermal spreader is inserted into the outer metal layer.

13. The power module of claim 12, wherein the outer metal layer is formed as an outer metal plate that is formed of a copper (Cu) material in a plate shape, and the outer thermal spreader is formed of a material including at least graphite, and disposed parallel to a surface facing the semiconductor chip among surfaces of the outer metal plate.

14. The power module of claim 13, wherein the outer thermal spreader is formed of a graphene.

\* \* \* \* \*